(12) United States Patent
Zivkovic et al.

(10) Patent No.: US 9,331,219 B2
(45) Date of Patent: May 3, 2016

(54) INTEGRATED CIRCUIT WITH DIRECTIONAL LIGHT SENSOR, DEVICE INCLUDING SUCH AN IC AND METHOD OF MANUFACTURING SUCH AN IC

(71) Applicant: NXP B.V., Eindhoven (NL)

(72) Inventors: Zoran Zivkovic, 's-Hertogenbosch (NL); Youri Ponomarev, Leuven (BE)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 14/398,709

(22) PCT Filed: May 2, 2013

(86) PCT No.: PCT/EP2013/059167
§ 371 (c)(1),
(2) Date: Nov. 3, 2014

(87) PCT Pub. No.: WO2013/167466
PCT Pub. Date: Nov. 14, 2013

(65) Prior Publication Data
US 2015/0171231 A1    Jun. 18, 2015

(30) Foreign Application Priority Data
May 11, 2012    (EP) .................................... 12167644

(51) Int. Cl.
*H01L 31/0232* (2014.01)
*G01S 3/784* (2006.01)
(Continued)

(52) U.S. Cl.
CPC ............. *H01L 31/0232* (2013.01); *G01S 3/784* (2013.01); *H01L 27/1443* (2013.01);
(Continued)

(58) Field of Classification Search
CPC .. H01L 31/0232; H01L 27/1443; H01L 31/18
See application file for complete search history.

(56) References Cited

U.S. PATENT DOCUMENTS

| 4,625,108 A | 11/1986 | Nestel et al. |
| 4,682,024 A | 7/1987 | Halldorsson et al. |

(Continued)

FOREIGN PATENT DOCUMENTS

| EP | 2 662 895 A1 | 11/2013 |
| JP | 62265740 | 4/1989 |

(Continued)

OTHER PUBLICATIONS

Agranov, G. et al. "Pixel continues to Shrink . . . Pixel Development for Novel CMOS Image Sensors", Aptina LLL, 4 pgs, retrieved from the internet at: www.imagesensors.org/.../016_paper_agranov_aptina_smallpix.pdf (2008).

(Continued)

*Primary Examiner* — Bilkis Jahan

(57) ABSTRACT

Disclosed is an integrated circuit comprising a substrate having a major surface; a directional light sensor, the directional light sensor comprising a plurality of photodetectors on a region of said major surface, said plurality of photodetectors comprising a set of first photodetectors for detecting light from a first direction and a set of second photodetectors for detecting light from a second direction, wherein a first photodetector is located adjacent to a second photodetector; and a light blocking structure comprising a first portion extending from said major surface in between the first photodetector and the second photodetector; and a second portion extending from the first portion and at least partially overhanging at least one of the first photodetector and the second photodetector. A device including such an IC and a method of manufacturing such an IC are also disclosed.

13 Claims, 4 Drawing Sheets

(51) Int. Cl.
  *H01L 31/02* (2006.01)
  *H01L 31/0216* (2014.01)
  *H01L 27/146* (2006.01)
  *H01L 27/144* (2006.01)
  *H01L 31/18* (2006.01)

(52) U.S. Cl.
  CPC .... *H01L27/14623* (2013.01); *H01L 31/02024* (2013.01); *H01L 31/02164* (2013.01); *H01L 31/02325* (2013.01); *H01L 31/18* (2013.01)

(56) References Cited

U.S. PATENT DOCUMENTS

| | | | |
|---|---|---|---|
| 4,760,436 A | | 7/1988 | Yi Zi |
| 4,924,285 A | | 5/1990 | Anderson et al. |
| 5,029,251 A | | 7/1991 | Sundberg |
| 5,055,894 A | | 10/1991 | Chan |
| 5,391,869 A | | 2/1995 | Ade et al. |
| 5,602,384 A | * | 2/1997 | Nunogaki ............ B60H 1/0075 126/573 |
| 5,719,670 A | | 2/1998 | Duboz et al. |
| 5,767,507 A | | 6/1998 | Unlu et al. |
| 5,994,724 A | | 11/1999 | Morikawa |
| 6,081,018 A | * | 6/2000 | Nakashiba ........ H01L 31/02162 257/232 |
| 6,455,836 B1 | * | 9/2002 | Hula ................ H01L 27/1446 250/208.1 |
| 6,521,882 B1 | | 2/2003 | Sumiya et al. |
| 6,875,974 B2 | * | 4/2005 | Muesch ................ G01S 3/7835 250/203.1 |
| 7,838,956 B2 | | 11/2010 | McCarten et al. |
| 8,358,419 B2 | | 1/2013 | Walters |
| 8,704,152 B2 | | 4/2014 | Svajda et al. |
| 8,901,225 B2 | | 12/2014 | Okuda et al. |
| 8,901,480 B2 | * | 12/2014 | Michiyama ............ G01J 1/0266 250/216 |
| 2005/0202579 A1 | | 9/2005 | Huang et al. |
| 2006/0043515 A1 | | 3/2006 | Ford |
| 2007/0290284 A1 | | 12/2007 | Shaffer |
| 2011/0018007 A1 | | 1/2011 | Kasahara et al. |
| 2011/0241079 A1 | * | 10/2011 | Oike ................ H01L 27/14616 257/225 |
| 2013/0026548 A1 | | 1/2013 | McCarten et al. |
| 2013/0037700 A1 | | 2/2013 | Michiyama |
| 2014/0039290 A1 | | 2/2014 | De Graff et al. |
| 2014/0045730 A1 | | 2/2014 | Walters |
| 2014/0149764 A1 | | 5/2014 | Gunther et al. |
| 2014/0203391 A1 | | 7/2014 | Daamen et al. |

FOREIGN PATENT DOCUMENTS

| | | |
|---|---|---|
| WO | 2009/087531 A1 | 7/2009 |
| WO | 2010/041198 A1 | 4/2010 |
| WO | 2011/160130 A2 | 12/2011 |
| WO | 2012/032753 A1 | 3/2012 |

OTHER PUBLICATIONS

Rhodes, H. et al. "The Mass Production of BSI CMOS Image Sensors", OmniVision Technologies, Inc., 6 pgs, retrieved from the internet at: www.imagesensors.org/.../006_paper_rhodes_omnivision_bsi.pdf.

"An Objective Look at FSI and BSI", An Aptina Technology White Paper, 6 pgs, retrieved from the Internet at: www.aptina.com/news/FSI-BSI-WhitePaper.pdf.

Tambo, Toyokazu, et al; "Search Method of Sun Using Fixed Five Photodiode Sensor"; Transactions of the Institute of Electrical Engineers of Japan, Part E, Institute of Electrical Engineers of Japan, vol. 129, No. 2; Japan; p. 53 (Feb. 1, 2009).

International Search Report for application PCT/EP2013/059167.

US Office Action from U.S. Appl. No. 13/887,144 (Dec. 10, 2015).

* cited by examiner

INTEGRATED CIRCUIT WITH DIRECTIONAL LIGHT SENSOR, DEVICE INCLUDING SUCH AN IC AND METHOD OF MANUFACTURING SUCH AN IC

FIELD OF THE INVENTION

The present invention relates to an integrated circuit (IC) comprising a substrate having a major surface; a directional light sensor, the directional light sensor comprising a plurality of photodetectors on a region of said major surface, said plurality of photodetectors comprising a set of first photodetectors for detecting light from a first direction and a set of second photodetectors for detecting light from a second direction, wherein a first photodetector is located adjacent to a second photodetector.

The present invention further relates to a device including such an IC.

The present invention yet further relates to a method of manufacturing such an IC.

BACKGROUND OF THE INVENTION

Nowadays, integrated circuits may comprise a plethora of different sensors, such as ambient light (AL) sensors, temperature (T) sensors, gas sensors, relative humidity (RH) sensors, specific analyte detection sensors, and so on.

Integrated circuits of this kind have a wide range of applications. For example, they can be used in the field of supply chain management to track and monitor the freshness of food and beverages. They can also be used as environmental sensors, for example as part of a heating, ventilation and air conditioning (HVAC) system in an automobile or in a building (e.g. a Smart Building). Additional applications include those in agricultural (e.g. the sensing of environmental conditions in greenhouses) or in medical fields. Their provision in mobile communications devices such as mobile telephones, tablets or laptops can also enable a wide range of further applications that require measurements of local environmental factors.

The provision of sensors in integrated circuits of this kind allows devices to be produced that have a small form factor, and which can be manufactured cheaply in large numbers using established semiconductor processing techniques.

Due to their small form factor, integrated circuits of this kind can easily be included in Radio Frequency Identification (RFID) tags, allowing for easy programming and readout.

There is a constant desire to diversify the sensor functionality integrated into an IC to add further functionality to a device utilizing the IC. For instance, WO 2009/087531 by the present applicant discloses an IC having a light sensor that can detect both the intensity and direction of incident light, e.g. to compensate the output of a display device for ambient lighting conditions to improve the user experience of the display device. To this end, the light sensor comprises a dielectric layer, wherein the dielectric layer is substantially transparent to the incident light as well as a plurality of photo detectors coupled relative to the dielectric layer for detecting the incident light through the dielectric layer. A plurality of stacks of opaque slats embedded within the dielectric layer approximately parallel to an interface between the dielectric layer and the photo detectors are also present to define tapered light apertures between adjacent stacks of opaque slats.

Such a light sensor requires a relatively complex arrangement of tapered stacks of slats to make the light sensor directionally sensitive. There exists a need to simplify the design of such a light sensor.

SUMMARY OF THE INVENTION

The present invention seeks to provide an IC according to the opening paragraph in which sensitivity to the directionality of incident light is provided in a more straightforward manner.

The present invention further seeks to provide a device including such an IC.

The present invention yet further seeks to provide a method of manufacturing such an IC.

According to an aspect of the present invention, there is provided an integrated circuit comprising a substrate having a major surface; a directional light sensor, the directional light sensor comprising a plurality of photodetectors on a region of said major surface, said plurality of photodetectors comprising a set of first photodetectors for detecting light from a first direction and a set of second photodetectors for detecting light from a second direction, wherein a first photodetector is located adjacent to a second photodetector; and a light blocking structure comprising a first portion extending from said major surface in between the first photodetector and the second photodetector; and a second portion extending from the first portion and at least partially overhanging at least one of the first photodetector and the second photodetector.

By providing a light blocking structure that extends from the substrate and at least partially overhangs at least one of the photodetectors of the IC, this photodetector is at least partially shaded by the light blocking structure from incident light under certain angles. This causes a reduction in the output signal of the shaded photodetector compared to photodetectors in the IC that more exposed to the incident light under this angle, which difference in respective output signals can be processed to determine the angle of incidence of the detected light.

Preferably, the second portion at least partially overhangs the first photodetector and the second photodetector such that the first photodetector is at least partially shaded from light from said second direction and the second photodetector is at least partially shaded from light from said first direction. In this embodiment a single light blocking structure provides direction-dependent shading to multiple photodetectors, thereby providing directional sensitivity to the light sensor in a simple but effective manner.

In an embodiment, the second portion completely overhangs the first photodetector and the second photodetector to maximize the discrimination between light from the first direction and the second direction respectively. In other words, if the second portion completely overhangs the first photodetector and the second photodetector, this narrows the respective viewing angles of the photodetectors, thereby further improving the resolution of the directional light sensor.

The first portion and the second portion may comprise respective metal structures, such as metal structures from a metallization stack. This has the advantage that the IC can be manufactured in a particularly cost effective manner as no additional masks are required to manufacture the IC; instead, the masks required to pattern the metallization layers of the IC can simply be adapted to include the light blocking structures.

In an embodiment, each first photodetector is located adjacent to a different second photodetector, and wherein the integrated circuit comprises a plurality of said light blocking structures, each of said light blocking structures having a first portion extending from said major surface in between one of the first photodetectors and the adjacent second photodetector. By having a plurality of such first and second photodetectors the sensitivity of the directional light sensor is further improved.

Preferably, the plurality of light blocking structures include a first light blocking structure and a second light blocking structure, wherein the first light blocking structure and second first light blocking structure cooperate to restrict the range of angles of incidence of light to which at least one of a first photodetector and a second photodetector can be exposed. By distributing the light blocking structures over the substrates such that the light blocking structures cooperate to block selected photodetectors from exposure to light at unwanted angles of incidence, improved control over the viewing angle of the selected photodetectors is obtained.

The photodetectors may be organised in a plurality of clusters of photodetectors, each cluster comprising a first photodetector and a second photodetector adjacent to the first photodetector in said cluster. Such clusters may be organized along respective edges of said region, the integrated circuit further comprising a further light sensor at least partially located in a central part of said region. Such a further light sensor may for instance be used as a forward looking sensor, thus further diversifying the functionality of the IC without requiring additional silicon real estate.

The neighbouring clusters along the same edge of the region may be spatially separated by a portion of the further light sensor to further increase the area and, consequentially, the sensitivity of the further light sensor.

The IC may comprise any suitable number of groups of photodetectors. For instance, the plurality of photodetectors may further comprise a set of third photodetectors for detecting light from a third direction and a set of fourth photodetectors for detecting light from a fourth direction, wherein each cluster is a quadrant of photodetectors further comprising one of said third photodetectors and an adjacent fourth photodetector, wherein the second portion of the light blocking structure at least partially overhangs each of said photodetectors in said quadrant. This yields a highly directional light sensor using only a limited number of light blocking elements, i.e. only one light blocking element per N photodetectors in each cluster, in which N is a positive integer.

The integrated circuit may further comprise an encapsulant covering the major surface, said encapsulant comprising an opening exposing raid region. This gives additional protection to the IC whilst at the same time leaving exposed the directional light sensor, such that the encapsulant does not compromise the operability of this sensor.

In an embodiment, the integrated circuit further comprises a non-volatile memory (NVM) at least partially shaded by a light blocking structure extending from said major surface. This protects such a NVM from (over)exposure to light, which reduces the risk of damage and consequential data loss from the NVM.

According to another aspect of the present invention, there is provided a device comprising the integrated circuit according to an embodiment of the present invention. Such a device may for instance be a radio frequency identification tag, a mobile communications device, a display device or a heating, ventilation and air-conditioning (HVAC) system for reasons already explained in the background section of this application.

According to yet another aspect of the present invention, there is provided a method of manufacturing an integrated circuit, the method comprising providing a semiconductor substrate having a major surface; and providing a directional light sensor in the integrated circuit by forming a plurality of photodetectors on the major surface, said plurality of photodetectors comprising a set of first photodetectors for detecting light from a first direction and a set of second photodetectors for detecting light from a second direction, wherein a first photodetector is located adjacent to a second photodetector; and forming at least one light blocking structure on the major surface, each of said light blocking structures comprising a first portion extending from said major surface in between the first photodetector and the second photodetector; and a second portion extending from the first portion and at least partially overhanging at least one of the first photodetector and the second photodetector.

An IC including such a directional light sensor can be manufactured without requiring additional processing steps to form the light blocking structures.

BRIEF DESCRIPTION OF THE DRAWINGS

Embodiments of the invention are described in more detail and by way of non-limiting examples with reference to the accompanying drawings, wherein.

DETAILED DESCRIPTION OF THE EMBODIMENTS

Figure 1:
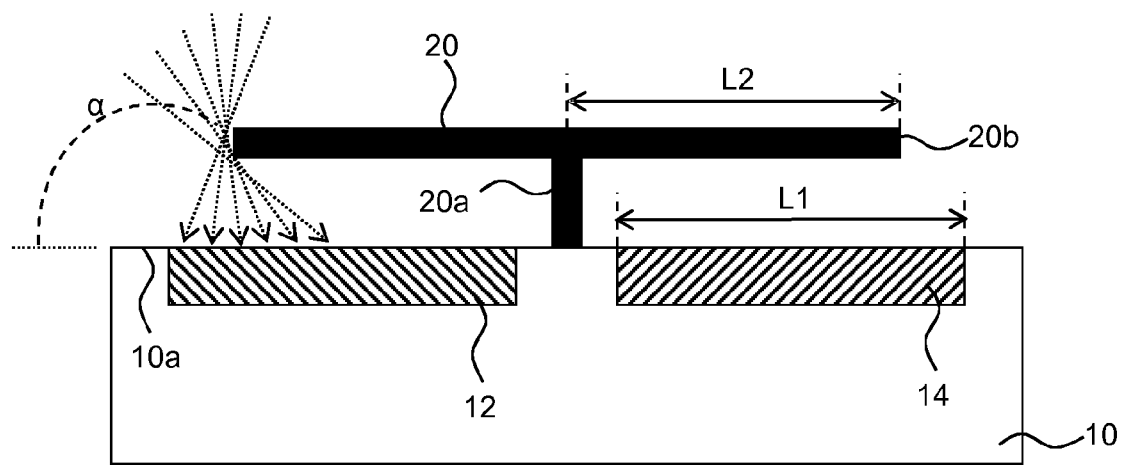
FIG. 1 schematically depicts an aspect of an IC according to an embodiment of the present invention.

It should be understood that the Figures are merely schematic and are not drawn to scale. It should also be understood that the same reference numerals are used throughout the Figures to indicate the same or similar parts.

FIG. 1 schematically depicts an IC according to an embodiment of the present invention. The IC comprises a substrate 10, which may be any suitable substrate, e.g. a semiconductor substrate such as a silicon substrate, a silicon on insulator substrate, a silicon germanium substrate, and so on. The substrate 10 comprises a main surface 10a having a region on which a first photodetector 12 and a second photodetector 14 are formed. In the context of the present application, 'formed on' is intended to at least include an embodiment in which the first photodetector 12 and the second photodetector 14 are formed on top of the main surface 10a, an embodiment in which the first photodetector 12 and the second photodetector 14 are formed partially in the main surface 10a and an embodiment in which the first photodetector 12 and the second photodetector 14 are formed embedded in the main surface 10a, i.e., sharing its photosensitive surface with the main surface 10a.

The photodetector 12 and a second photodetector 14 form part of a directional light sensor, which may comprise a plurality of groups of photodetectors for determining the intensity and directionality of the incident light as will be explained in more detail later. For instance, the directional light sensor may comprise a set or group of first photodetectors 12, said set comprising at least one first photodetector 12 and a set or group of a second photodetectors 14, said set comprising at least one second photodetector 14. In FIG. 1, the first photodetector 12 and the second photodetector 14 are laterally separated from each other by way of non-limiting example only. It is equally feasible that the first photodetector 12 abuts the second photodetector 14, as will be shown later.

In embodiments of the IC of the present invention, the IC comprises a directional light sensor including at least one pair of the first photodetector 12 and the second photodetector 14, in which the first photodetector 12 is located adjacent to the second photodetector 14.

The IC according to embodiments of the present invention further comprises at least one light blocking structure 20 placed in between the first photodetector 12 and the second photodetector 14. The light blocking structure 20 is made of an opaque material such as a metal and is used to prevent exposure of the first photodetector 12 and/or the second photodetector 14 to incident light of certain angles of incidence. In other words, the light blocking structure 20 limits the range of angles of incidence to which the first photodetector 12 and/or the second photodetector 14 are exposed. This is schematically depicted in FIG. 1 by the range α of angles of incidence of the light to which the first photodetector 12 can be exposed. This range will also be referred to as the viewing angle of the shielded photodetector. Part of the incident light to which the first photodetector 12 can be exposed is schematically shown in FIG. 1 by the dashed arrows.

The light blocking structure 20 is used to reduce the overlap between the respective ranges of angles of incidence of the light to which the first photodetector 12 and the second photodetector 14 are exposed. To this end, the light blocking structure 20 has a first portion 20a that extends from the main surface 10a of the substrate 10 and a second portion 20b that extends from the first portion 20a. In an embodiment, the second portion 20b may be supported by the first portion 20a, e.g. the second portion 20b may be an opaque cover plate on the first portion 20a.

The first portion 20a and the second portion 20b combine to shield part of an adjacent photodetector from exposure to light at certain angles of incidence. Specifically, the second portion 20b at least partially overhangs at least one of the first photodetector 12 and the second photodetector 14 to shield the underlying photodetector from light at certain angles of incidence, i.e. light outside the viewing angle of the underlying photodetector. In the context of the present invention, the term 'overhangs' means that at least part of the photodetector lies underneath the second portion 20b when viewing the main surface 10a of the substrate 10 along the axis perpendicular to the main surface 10a. In other words, the second portion 20b covers or shades at least part of the underlying photodetector.

FIG. 1 schematically depicts a preferred embodiment in which the second portion 20b of the light blocking structure 20 at least partially overhangs the first photodetector 12 as well as the second photodetector 14 such that the first photodetector 12 is at least partially shaded from light at angles of incidence within the viewing angle of the second photodetector 14 and the second photodetector 14 is at least partially shaded from light at angles of incidence within the viewing angle of the first photodetector 12.

Consequently, when the IC is exposed to light from a first direction, i.e. having a first angle of incidence, the first photodetectors 12 of the IC will produce a noticeably stronger photo-induced signal than the second photodetectors 14, whereas when the IC is exposed to light from a second direction, i.e. having a second angle of incidence, the second photodetectors 14 of the IC will produce a noticeably stronger photo-induced signal than the first photodetectors 12. These signals can be differentiated by a signal processor (not shown) to detect the orientation of the IC relative to this angle of incidence. The intensity of the signals can be used to derive the intensity of the incident light as is also well known per se.

It is noted that the first portion 20a of the light blocking structure 20 already provides a degree of shading of the adjacent photodetectors. However, the height of the first portion 20a is typically limited to a few microns, especially when the light blocking structure 20 is formed in the metallization stack of the IC, as will be explained in more detail later. In contrast, the dimensions of an individual photodetector on the main surface 10a can be several tens of microns, e.g. 100 microns×100 microns to increase the sensitivity of the photodetector. In such a scenario, the first portion 20a provides effective shading for light incident at shallow angles only, in which the angle of incidence is defined relative to the main surface 10a of the substrate 10. Consequently, a large overlap exists between the respective viewing angles of the first photodetector 12 and the second photodetector 14, which severely limits the resolution of the directional light sensor.

This problem is addressed by the addition of the second portion 20b to the light blocking structure 20, which significantly reduces the overlap between the respective viewing angles of the first photodetector 12 and the second photodetector 14. Each of the first photodetector 12 and the second photodetector 14 may have a lateral dimension L1 and the second portion 20b may have a lateral dimension L2 that at least partially overlaps with the lateral dimension L1. The larger the overlap, the smaller the overlap in the viewing angles of the first photodetector 12 and the second photodetector 14.

In an embodiment, L2 at least equals L1, i.e. the second portion 20b overhangs the complete first photodetector 12 and/or the second photodetector 14. It can be immediately understood that in this scenario the limit of the viewing angle of each photodetector is 90°, i.e. light with an angle of incidence perpendicular to the main surface 10a, such that there is zero overlap between the viewing angles of the first photodetector 12 and the second photodetector 14 when the second portion 20b overhangs the complete first photodetector 12 and the complete second photodetector 14.

It should be understood that in FIG. 1 the second portions 20b overhangs complete first photodetector 12 and the second photodetector 14 in equal amounts by way of non-limiting example only. The amount of overhang may be individually optimized, i.e. respective photodetectors may be shielded by one or more light blocking structure 20 in equal or different amounts.

Figure 2:
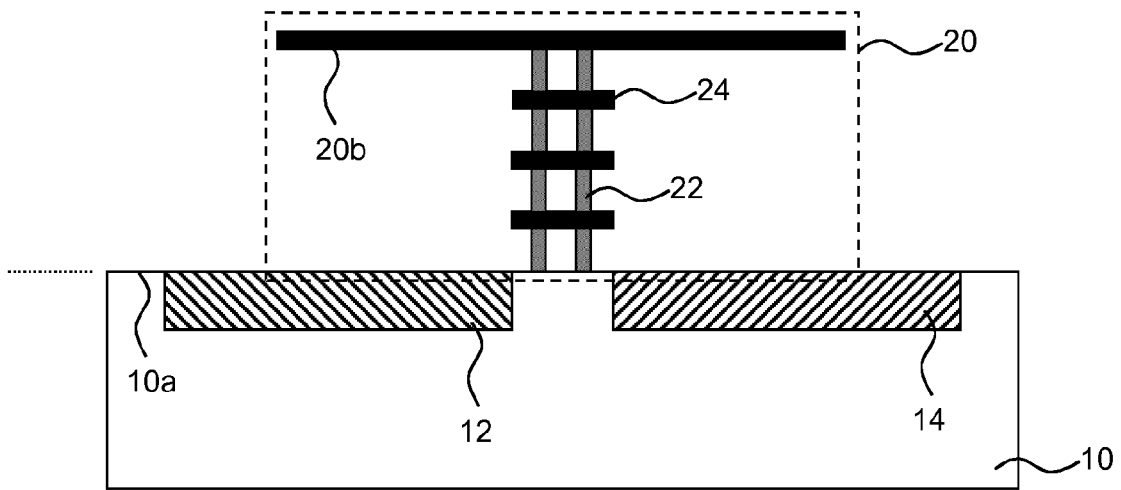
FIG. 2 schematically depicts an aspect of an IC according to another embodiment of the present invention.

A particularly preferred embodiment of the IC according to the present invention is shown in FIG. 2. In this embodiment, the light blocking structure 20 is formed as part of the metallization stack of the IC. This has the advantage that the IC may be manufactured without additional processing steps in the backend part of the manufacturing process, as the features that form the light blocking structure 20 can be defined in the mask set required to form the metallization stack over the substrate 10.

The metallization stack comprises at least one metal layer portion 24, with neighbouring metal layer portions 24 being separated by one or more electrically insulating layers (not shown) and/or by conductive interconnections in the form of vias 22. The vias 22 and the metal portions 24 are typically opaque. Specifically, in an embodiment, the vias 22 may extend through one or more dielectric layers. In another embodiment, the vias 22 have been released, i.e. the dielectric layers through which the vias 22 were formed have been removed using one or more suitable etch recipes. In yet another embodiment, no vias 22 are provided in between neighbouring metal layer portions 24, in which case the neighbouring metal layer portions 24 are separated by one or more dielectric layers. As the dielectric layers may not be fully opaque, this embodiment preferably is contemplated if the first portion 20a of the light blocking structure 20 does not perform a light blocking role, but is merely provided to support the second portion 20b.

Any suitable material may be used to form the metallization stack, such as Ti, TiN, Al, Cu and combinations thereof to define the metal portions 24, tungsten to form the vias 22, and silicon oxide, silicon nitride, low-k dielectrics and other dielectric materials as well as combinations thereof to form the one or more dielectric layers in between the metal layers of the metallization stack. The metallization stack may comprise any suitable number of metal layers. The second portion 20b is typically formed in one of the metal layers of the metallization stack. In FIG. 2, the second portion 20b is formed in the upper metal layer of the metallization stack by way of non-limiting example only.

Figure 3:
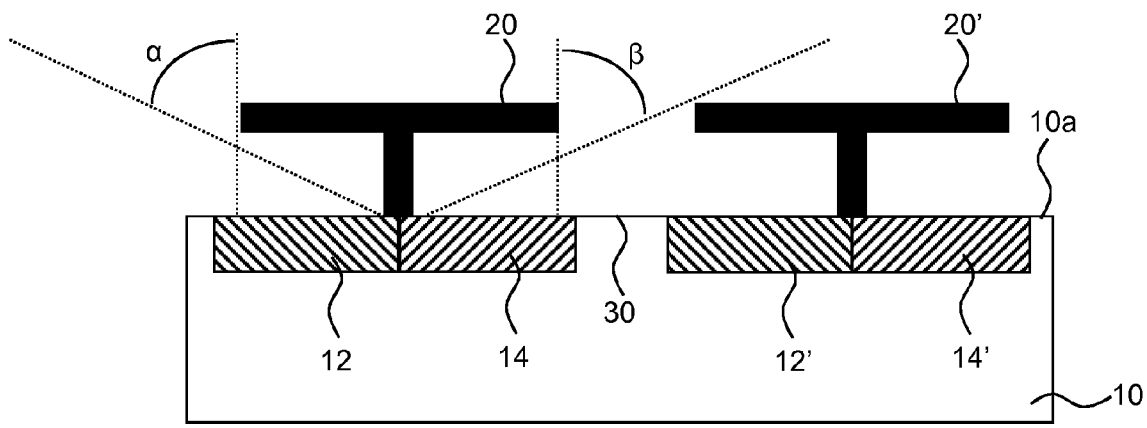
FIG. 3-5 respectively schematically depict a cross-section, a top view and a perspective view of an aspect of an IC according to yet another embodiment of the present invention.

FIG. 3 schematically depicts an IC according to another embodiment of the present invention. In this embodiment, the directional light sensors comprises a pair of first photodetectors 12, 12' and a pair of second photodetectors 14, 14' grouped into two clusters onto the main surface 10a of the substrate 10. The clusters are laterally separated by a photosensitive region 30, which may form part of a forward looking light sensor as shown in more detail in FIGS. 4 and 5.

The first cluster comprises a first photodetector 12 adjacent to a second photodetector 14, wherein a first light blocking structure 20 is placed at the boundary between the first photodetector 12 and the second photodetector 14. The first light blocking structure 20 has a portion that overhangs the first photodetector 12 and the second photodetector 14 as previously explained.

The second cluster comprises a first photodetector 12' adjacent to a second photodetector 14', wherein a second light blocking structure 20' is placed at the boundary between the first photodetector 12' and the second photodetector 14'. The second light blocking structure 20' has a portion that overhangs the first photodetector 12' and the second photodetector 14' as previously explained.

As can be seen in FIG. 3, neighbouring light blocking structures, here the first light blocking structure 20 and the second light blocking structure 20', may cooperate to delimit the viewing angle range of at least some of the photodetectors shielded by these light blocking structures. For instance, the viewing angle range β of the second photodetector 14 is delimited by the part of the first light blocking structure 20 that overhangs the second photodetector 14 and the part of the second light blocking structure 20' that overhangs the first photodetector 12'. Similarly, the viewing angle range α of the first photodetector 12' is delimited by the part of the first light blocking structure 20 that overhangs the second photodetector 14 and the part of the second light blocking structure 20' that overhangs the first photodetector 12'. The viewing angle range α of the first photodetector 12' has been shown for the first photodetector 12 for reasons of clarity. It should be understood that the first photodetectors 12 and 12' may have the same viewing angle range α, for instance in case a further cluster of photodetectors with a further light blocking structure is located on the left hand side of the cluster including the first photodetector 12 and the second photodetector 14.

As can be readily understood from FIG. 3, the respective viewing angles of the directional photodetectors can be controlled by controlling the amount of overhang of second portions 20b of the respective light blocking structures 20 over the underlying photodetectors. In other words, the respective viewing angles of the directional photodetectors can be controlled by controlling the dimensions of the second portions 20b of the respective light blocking structures 20, thereby controlling the amount of coverage provided by the second portions 20b.

Although two of such clusters are shown, it should be understood that the substrate 10 may carry any suitable number of such clusters, with each cluster comprising any suitable number of photodetectors. Each of the photodetectors in such a cluster may be arranged to detect light with an angle of incidence in a specific range, wherein the overlap between the various ranges preferably is minimized through one or more light blocking structures having a second portion at least partially extending over the respective photodetectors in such a cluster.

Figure 4:
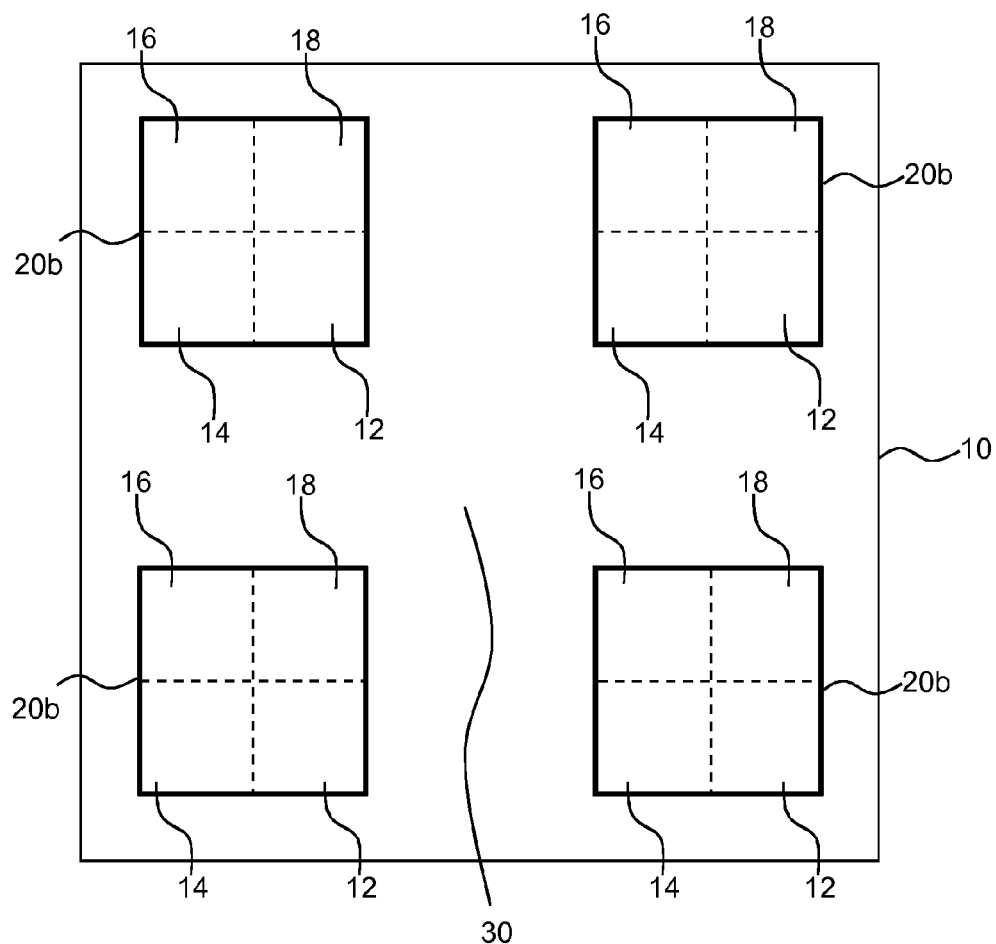
Figure 5:
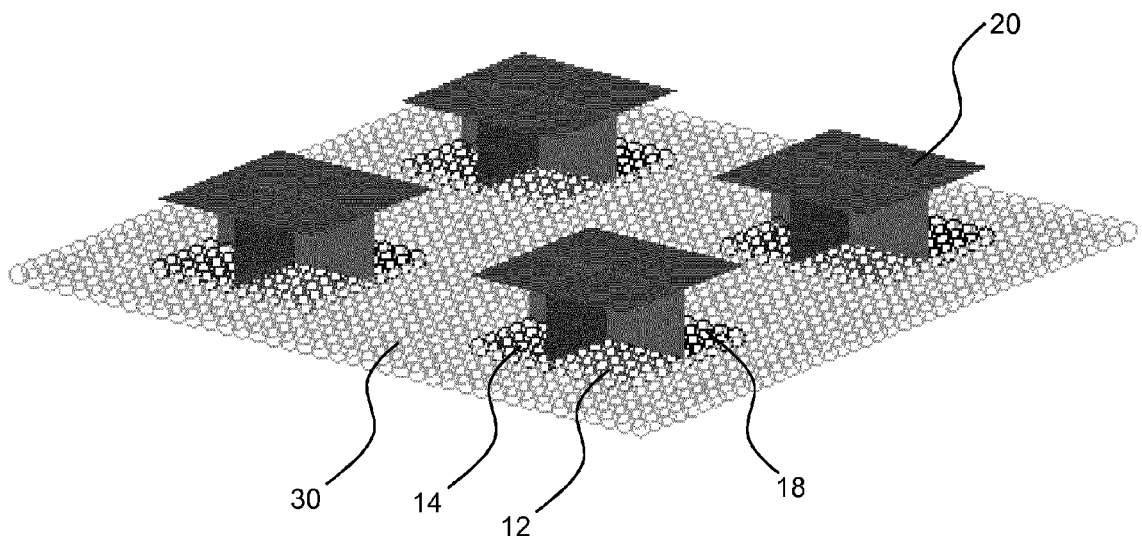

FIG. 4 schematically depicts a top view and FIG. 5 schematically depicts a perspective view of an IC according to yet another embodiment of the present invention. In this embodiment, the IC comprises four clusters of photodetectors by way of non-limiting example. Each cluster comprises a first photodetector 12, a second photodetector 14, a third photodetector 16 and a fourth photodetector 18 organized in a quadrant, such that the directional light sensor comprises four sets of photodetectors, each set comprising four photodetectors with each photodetector located in a different cluster. Each cluster comprises a light blocking structure 20 in which the second portion 20b has a square surface that extends over, i.e. overhangs, the respective surfaces of the first photodetector 12, the second photodetector 14, the third photodetector 16 and the fourth photodetector 18. Each second portion 20b is supported by a '+'-shaped first portion 20a that is placed on the substrate 10 at the respective interfaces between the first photodetector 12, the second photodetector 14, the third photodetector 16 and the fourth photodetector 18.

In an embodiment, the clusters are arranged along the edges of a photosensitive region of the substrate 10, such that the clusters are separated by a photosensitive region 30 that can act as a separate light sensor, e.g. a sensor having a forward looking viewing angle. The sensor 30 may form part of the light directional sensor further including the photodetectors 12, 14, 16 and 18.

In FIGS. 4 and 5, the respective photodetectors are clustered in quadrants by way of non-limiting example only. It should be understood that such clusters may have any suitable geometric shape and may comprise any suitable number of photodetectors. It should be understood that the higher the number of photodetectors, the higher the degree of sensitivity and directionality with which the directional light sensor is able to evaluate the direction of the incident light with respect to the surface normal of the major surface 10a of the substrate 10.

Figure 6:
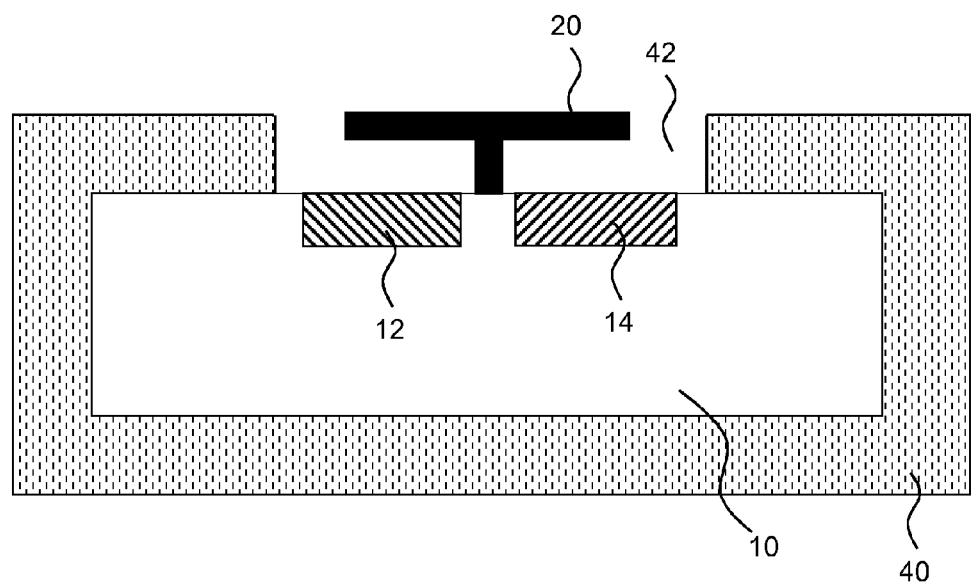
FIG. 6 schematically depicts an aspect of an IC according to yet another embodiment of the present invention.

The IC may be encapsulated to protect the components of the IC from damage. This is shown in FIG. 6, in which the substrate 10 is encapsulated in an encapsulant 40 having an opening 42 that exposes the directional light sensor of the IC, here schematically represented by a first photodetector 12 and an adjacent second photodetector 14 with a light blocking structure 20 placed in between the first photodetector 12 and the second photodetector 14 as previously explained. The encapsulant 40 may be any suitable material, e.g. a resin such as an epoxy resin. Such materials are well-known per se to the skilled person.

Figure 7:
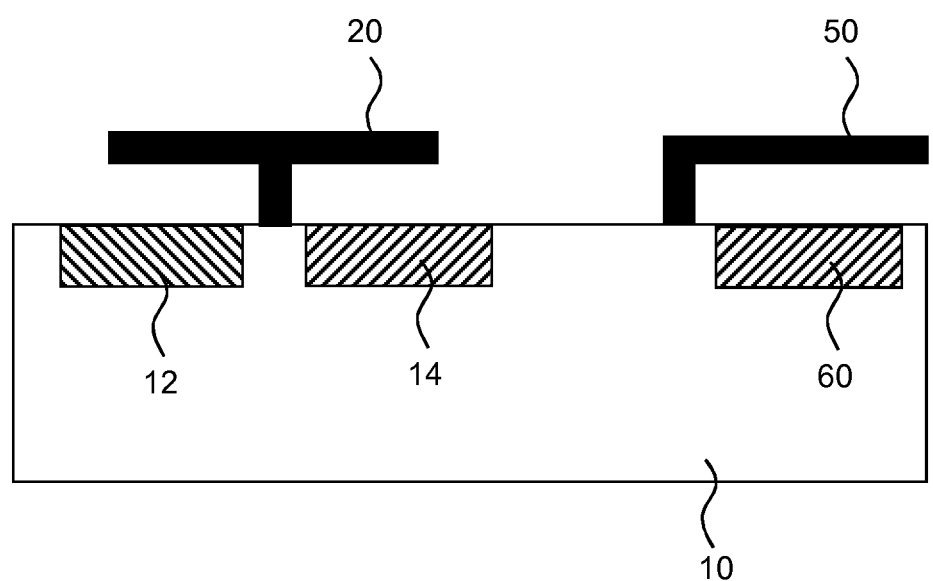
FIG. 7 schematically depicts an aspect of an IC according to yet another embodiment of the present invention.

As will be understood, the IC according to embodiments of the present invention may comprise components in addition to the directional light sensor, e.g. one or more signal processors, data storage elements such as memories, and so on. Specifically, the IC may comprise a non-volatile memory (NVM) 60. It is known per se that NVMs can deteriorate when exposed to light. This is of course unwanted, as this can lead to data loss and malfunctioning of the IC as a consequence. This may be prevented by the embodiment shown in FIG. 7, in which the IC comprises a further light blocking structure 50 that at least partially overhangs the NVM 60. The further light blocking structure 50 may be a dedicated light blocking structure or alternatively may be a light blocking structure shared with one or more photodetectors.

The IC according to embodiments of the present invention may also be used as a motion sensor, for instance to detect (hand) gestures made in front of a device incorporating the IC. Such gestures tend to obscure parts of the sensor from exposure to light, which can be detected by the respective photodetectors in different spatial locations of the sensor.

The IC according to embodiments of the present invention may be integrated in a device. For example, the device may be a Radio Frequency Identification (RFID) tag, a mobile communications device, examples of which include mobile telephones, tablets and laptops. The device alternative may be a heating, ventilation and air conditioning (HVAC) system. The HVAC system can, for example, be provided in an automobile or in a building (e.g. a Smart Building).

The device may be a display device, in which case the directional light sensor of the IC may be used to provide information about the directionality of incident ambient light, which information may be used to adjust e.g. the brightness of (parts of) the image displayed on the display device to compensate for the incident light. Other applications can include use in the field of supply chain management to track and monitor the freshness of food and beverages. Additional applications include those in agricultural (e.g. the sensing of environmental conditions in greenhouses) or in medical fields.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. An integrated circuit comprising a substrate having a major surface;
   a directional light sensor, the directional light sensor comprising a plurality of photodetectors on a region of said major surface, said plurality of photodetectors comprising a set of first photodetectors for detecting light from a first direction and a set of second photodetectors for detecting light from a second direction, wherein a first photodetector in the first set is located adjacent to a second photodetector in the second set; and
   a light blocking structure comprising:
   a first portion extending from said major surface in between the first photodetector and the second photodetector; and
   a second portion extending from the first portion and at least partially overhanging at least one of the first photodetector and the second photodetector; and
   a plurality of clusters of photodetectors, each cluster comprising a photodetector from the first set adjacent to a photodetector from the second set;
   wherein said clusters are organized along respective edges of said region, the integrated circuit further comprising a further light sensor at least partially located in a central part of said region, wherein neighboring clusters along a same edge of the region are spatially separated by a portion of the further light sensor.

2. The integrated circuit of claim 1, wherein the second portion at least partially overhangs the first photodetector and the second photodetector such that the first photodetector is at least partially shaded from light from said second direction and the second photodetector is at least partially shaded from light from said first direction.

3. The integrated circuit of claim 1, wherein the second portion completely overhangs the first photodetector and the second photodetector.

4. The integrated circuit of claim 1, further comprising an encapsulant covering the major surface, said encapsulant comprising an opening exposing said region.

5. The integrated circuit of claim 1, further comprising a non-volatile memory at least partially shaded by a further light blocking structure extending from said major surface.

6. The integrated circuit of claim 1, wherein the first portion and the second portion comprise respective metal structures.

7. The integrated circuit of claim 6, wherein said respective metal structures are metal structures from a metallization stack.

8. A device comprising the integrated circuit of claim 1.

9. The device of claim 8, wherein the device is one of:
   a radio frequency identification tag;
   a mobile communications device;
   a display device; and
   a heating, ventilation and air-conditioning (HVAC) system.

10. The integrated circuit of claim 1, wherein each first photodetector is located adjacent to a different second photodetector, and wherein the integrated circuit comprises a plurality of said light blocking structures, each of said light blocking structures having a first portion extending from said major surface in between one of the first photodetectors and the adjacent second photodetector.

11. The integrated circuit of claim 10, wherein the plurality of light blocking structures include a first light blocking structure and a second light blocking structure, wherein the first light blocking structure and second light blocking structure cooperate to restrict the range of angles of incidence of light to which at least one of a first photodetector and a second photodetector can be exposed.

12. The integrated circuit of claim 11, wherein said plurality of photodetectors further comprises a set of third photodetectors for detecting light from a third direction and a set of fourth photodetectors for detecting light from a fourth direction, wherein each cluster is a quadrant of photodetectors further comprising one of said third photodetectors and an adjacent fourth photodetector, wherein the second portion of the light blocking structure at least partially overhangs each of said photodetectors in said quadrant.

13. A method of manufacturing an integrated circuit, the method comprising:
   providing a semiconductor substrate having a major surface; and
   providing a directional light sensor in the integrated circuit by:

forming a plurality of photodetectors on the major surface, said plurality of photodetectors comprising a set of first photodetectors for detecting light from a first direction and a set of second photodetectors for detecting light from a second direction, wherein a first photodetector is located adjacent to a second photodetector; and forming at least one light blocking structure on the major surface, each of said light blocking structures comprising:

a first portion extending from said major surface in between the first photodetector and the second photodetector;

a second portion extending from the first portion and at least partially overhanging at least one of the first photodetector and the second photodetector;

forming a plurality of clusters of photodetectors, each cluster comprising a photodetector from the first set adjacent to a photodetector from the second set;

wherein said clusters are organized along respective edges of said region; and forming a further light sensor at least partially located in a central part of said region, wherein neighboring clusters along a same edge of the region are spatially separated by a portion of the further light sensor.

* * * * *